United States Patent [19]

Engstrom

[11] Patent Number: 4,517,553
[45] Date of Patent: * May 14, 1985

[54] N-KEY ROLLOVER KEYBOARD

[75] Inventor: Keith A. Engstrom, River Grove, Ill.

[73] Assignee: Illinois Tool Works Inc., Chicago, Ill.

[ * ] Notice: The portion of the term of this patent subsequent to Jun. 28, 2000 has been disclaimed.

[21] Appl. No.: 457,884

[22] Filed: Apr. 4, 1974

Related U.S. Application Data

[60] Division of Ser. No. 339,476, Mar. 8, 1973, abandoned, which is a continuation of Ser. No. 144,902, May 19, 1971, abandoned.

[51] Int. Cl.³ .......................... G06F 3/02; G08C 15/12
[52] U.S. Cl. ............................ 340/365 S; 340/365 E; 340/365 L; 178/17 R; 84/1.01
[58] Field of Search .......................... 340/365; 178/17; 84/1.01, 115

[56] References Cited

U.S. PATENT DOCUMENTS

| | | | |
|---|---|---|---|
| 3,675,239 | 7/1972 | Ackerman et al. | 340/365 S |
| 3,683,371 | 8/1972 | Holz | 340/365 L |
| 3,792,466 | 2/1974 | Arnold et al. | 340/365 S |
| 3,828,643 | 8/1974 | Morez | 84/115 |

Primary Examiner—Marshall M. Curtis
Attorney, Agent, or Firm—Donald D. Mondul; T. W. Buckman

[57] ABSTRACT

An N-Key Rollover Type Keyboard sequentially scans the keys so as to transmit information correctly as to each key which is depressed without transmitting a garbled code which could result from simultaneous depression of two keys without the sequential scanning. The coded information from the keyboard is applied to a differential amplifier along with the noise signal from the keyboard so that only the coded signal is amplified, thus reducing the noise level quite markedly. The coded signal is fed to a shift register which is cycled once for each scanning of the keyboard so that a current scan can be compared with a past scan in a comparator or an AND gate with the result that there will be an output only for the first scan that detects a depressed key, i.e., the depression of the key will not cause continued signal transmission, but will cause such transmission once only. A strobe is generated only on the first scan. In addition, the keyboard is provided with various function keys which generate single channel non-coded output signals. A strobe inhibit circuit is provided to prevent strobing when a function key is depressed.

27 Claims, 3 Drawing Figures

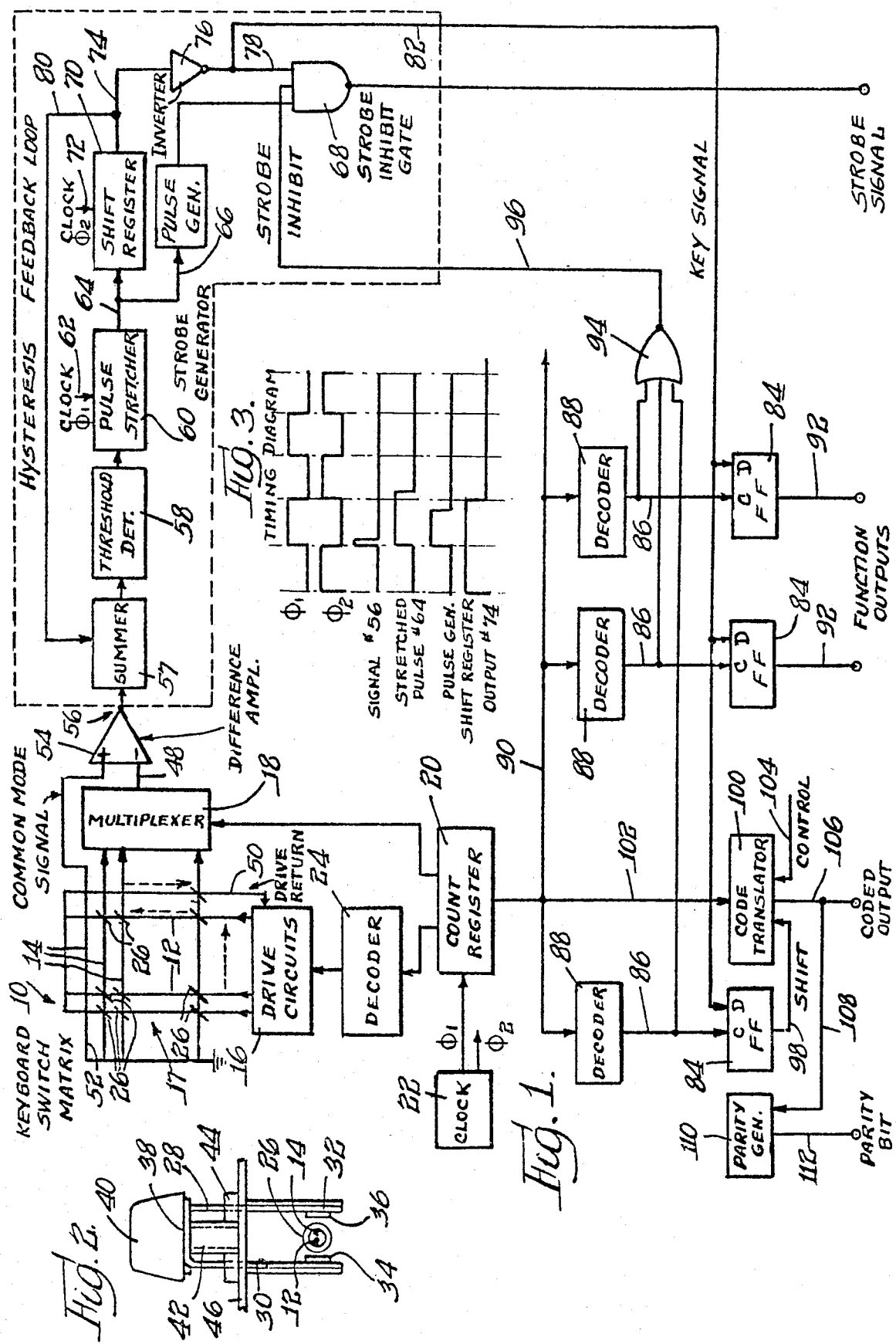

N-KEY ROLLOVER KEYBOARD

This application is a divisional application of United States patent application Ser. No. 339,476 now abandoned, which is a continuation of United States patent application Ser. No. 144,902, May 19, 1971 now abandoned; and the applicant claims the benefit of said earlier filing dates in accordance with 35 USC 120.

DESCRIPTION OF THE PRIOR ART

Keyboards comprise a well known means for feeding information into data processors. It will be understood that two keys can be depressed substantially simultaneously, and it further will be understood that the two keys should not simultaneously transmit information. Such information can be garbled, resulting in a false code. Heretofore this has been prevented by providing N-Key lockout and 2 Key Rollover, sometimes abbreviated as "NKL/2KR. NKL/2KR is defined for a given set of keys on the keyboard as that property which permits the given key to be transmitted if, and only if, that key is the only key in the set which is depressed (N-Key lockout) and further, the code of that given key is transmitted once only for each occurrence of the above condition (2 Key Rollover).

Although such a system has been satisfactory for many purposes, it has had some drawbacks. Many data terminal operators have been trained on electric typewriters and a second key may be depressed before a first one is released. This is particularly true in high speed "Burst Rate" typing. A common example is the word "the" which the typist is so used to typing that he will type it at a higher rate than his average typing speed. N-Key lockout is not satisfactory for such transmission, as the typist must be careful to avoid burst rate typing with NKL, and this destroys the typist's normal load of operation.

SUMMARY

In accordance with the present invention, a maxtrix of drive wires and sense wires is provided in a two dimensional scanning matrix. The drive wires scan along one axis of the matrix and the sense wires scan along the other axis. The drive wires are sequentially pulsed by a pulse drive circuit, while the sense wires are scanned by a multiplexer circuit. A common count register operated by a clock is used to time both the drive and multiplexing circuits. Each key switch in the keyboard has a location in the matrix depending on the code assignment of the respective key switch and hence on a particular drive and sense wire selected. A saturable core type solid state switch is provided for each key.

When a key is actuated a signal will appear at the output of the multiplexer, and the output of the multiplexer is applied to a differential amplifier along with a noise signal from the keyboard. The differential amplifier output is applied to a memory, specifically a shift register, and the output of the shift register is compared with the output of the differential amplifier in an AND gate such that there is a strobe signal generated only for the first scan of a depressed key.

Function keys also are provided, and each function key provides a continuous output. Function decoder outputs are coupled to a common OR circuit, the output of which is connected to a strobe inhibit gate.

BRIEF DESCRIPTION OF THE DRAWINGS

FIG. 1 is a schematic wiring diagram of an exemplication of the invention;

FIG. 2 is a cross-section through the keyboard showing one of the keys and its relation to the sense and drive wires; and FIG. 3 is a timing diagram as it applies to the strobe generator section.

DESCRIPTION OF PREFERRED EMBODIMENTS

Referring now in greater particularity to the drawings, and first to FIG. 1, an N-Key Rollover Type Keyboard in accordance with the present invention includes a two dimensional scanning matrix 10. The matrix includes a plurality of drive wires 12 arranged along one axis of the matrix, illustrated as the vertical axis, and a plurality of sense wire 14 arranged along the other axis, illustrated as horizontal. The drive wires or lines 12 are sequentially pulsed by a pulse drive circuit 16, while the sense wires or lines 14 are scanned by a multiplexer circuit 18. Timing of both the drive and multiplexing circuits is from a common count register 20 operated by a clock 22 having a first output $\phi_1$ and a second output $\phi_2$ delayed 180° relative to $\phi_1$. The connection from the count register to the drive circuits is through a decoder 24. The register 20 is advanced with each pulse of the clock and for each advance of the register a new switch position is selected, and a new binary output code provided. Each key switch in the keyboard will have a location in the matrix depending on its code assignment, which, in turn, is determined by the particular drive and sense wire selected.

One key and its relation to the matrix will be seen in FIG. 2, and this key is generally similar to that disclosed in detail and claimed in the co-pending application of Victor M. Bernin, Ser. No. 879,220 filed on Nov. 24, 1969 for solid state keyboard, which has issued into U.S. Pat. No. 3,638,221 issued Jan. 25, 1972.

As shown in FIG. 2 each crossover between a drive wire and a sense wire is threaded through a toroidal ferrite core 26. An inverted U-shaped steel or other magnetic member 28 has depending legs 30 and 32 respectively carrying magnets 34 and 36 which are magnetized in opposition to one another. Thus, for example, the magnet 34 may have a north pole at the left face thereof as viewed in FIG. 2 and a south pole at the right face confronting the ferrite core 26. Similarly, the magnet 36 has a north pole confronting the core 26 and a south pole at the remote face. The depending legs 30 and 32 and the interconnecting bight 38 of the inverted U-shaped member complete the magnetic circuit. The bight 38 of the U-shaped member is secured beneath a non-magnetic finger operated push button 40, such as of plastic, and a central structure 42 beneath the push button is provided with spring restoring means (not shown) for holding the button in a normally raised position illustrated above a flange 44 of the button structure which rests on a plate 46 which may be a common plate for the entire keyboard.

The magnets 34 and 36 normally hold the toroidal core 26 in magnetic saturation, and therefore no signal can be induced from the drive wire 12 to the sense wire 14. However, when the push button is depressed, the magnets move away from the toroidal core which comes out of magnetic saturation, whereby a signal on the drive wire will be inductively coupled to the sense wire threaded therewith through the toroidal core 26.

In order for the present invention to operate with a scanning system, the key must remain in a depressed condition for at least one scanning cycle. However, a scanning cycle is typically on the order of one hundred to five hundred microseconds, and it would be substantially impossible to depress a key and allow it to rise in that time. Hence, the time requirements are of no particular consequence in the operation of the keyboard.

Although the scanning system makes the operation of any key switch independent of the condition of any other key on the keyboard, the signal output of a depressed switch in this type system is inherently repeated once for each scanning cycle for as long as the switch remains in a depressed position. Obviously, only the first code generated by a depressed signal can be tolerated. Thus, all successive codes must be eliminated. Specifically, when a key is actuated, a signal will appear at the output. This pulse will appear in a time slot according to its position in the matrix, which will also correspond to the particular count or code in register 20. This pulse will trigger a storbe generator, to be discussed hereinafter, generating a single strobe pulse coincident with the correct code from the register.

Before continuing with the signal cancellation circuit and the strobe generator, it will be profitable to return briefly to the matrix 10. A typical matrix for a seven bit ASC11 code, as an example, would be a 16×8 matrix, consisting of sixteen drive lines and eight sense lines providing 128 code combination. 128 will also be recognized immediately by those skilled in the art as $2^7$, i.e., seven bits in a binary code. The drive scanning circuit consists of a 1 of 16 decoder coupled to 16 line drive amplifiers. The decoder 24 accepts a four bit address code (LSB) and the eight input multiplexer 18 accepts a three bit address code (MSB) from the count register. The multiplexer will advance one position for each 16 scans of the drive circuit.

A balance drive wire system is employed in the matrix in order to reduce cross talk (noise) interference between the drive and sense wires. A common drive return wire 50 is routed back through the drive wires in close proximity to the drive wires. The return drive current signal is equal in amplitude and opposite in phase to the drive wire signals. Cancellation of the field surrounding the drive lines therefore occurs, reducing unwanted drive signal from being coupled into the sense lines.

In order to improve the signal to noise ratio of the multiplex output signal, an additional sense line 52 is incorporated in the matrix. This line or wire is routed along the same path as the other sense wires, but is not looped through any of the ferrite cores 26. The additional or common sense line 52 will have thereon a common mode noise signal (coherent noise), and this wire 52 is connected to a difference amplifier 54 to which the output line 48 of the multiplexer is also connected. Since the noise on the line 52 will be similar to that on each of the sense wires 14, only the difference therebetween, i.e. the code signal will be amplified by the difference amplifier 54.

The output 56 of the difference amplifier 54 is applied to a summing circuit 57 the output of which is connected to a level or threshold detector 58. The threshold detector is in turn connected to a pulse stretcher 60 which has control input pulses of one phase, indicated in FIG. 3 as $\phi_1$, applied at 62 from the clock 22. The output from the pulse stretcher is taken at 64 and goes direct as at 66 to a pulse generator 67, the latter being connected to one input of a strobe inhibit gate 68.

In addition, the pulse stretcher output 64 is connected to a shift register 70 also having a control input at 72 from the clock 22 of opposite phase to that applied at 62 to the pulse stretcher, and indicated in FIG. 3 as $\phi_2$.

The keyboard pulses from the multiplexer are relatively narrow pulses (see FIG. 3, third line) and are nominally coincident with the beginning of a clock pulse. However, the shift pulses to the shift register are delayed one half clock period, viz. $\phi_2$ as compared with $\phi_1$ (lines 2 and 1 of FIG. 3). The pulse stretcher stretches the narrow input pulses (line 4 of FIG. 3) so that they can overlap the shift register advanced pulses in order that the keyboard data pulses from the multiplexer can be shifted into the register.

The output from the shift register as taken at 74 (see also bottom line of FIG. 3) is applied to an inverter 76, and the output from the inverter is connected at 78 to the strobe inhibit gate 68. Another way of looking at this is that the output from the pulse generator 67 is compared with the delayed and inverted signal pulse from the shift register in an AND gate. Thus, the first signal pulse to be generated as a result of a switch actuation will result in the generation of a strobe, since the delayed pulse is absent. However, the following signal pulse, on the next and other subsequent scanning cycles, will be inhibited by the delayed pulses from the shift register. Consequently, only one strobe pulse will be generated for a given key depression, no matter how long that particular key is held down.

As will be appreciated, the keyboard switch shown in FIG. 2 is an analog type switch, since its output signal level is proportional to the switch position. In order to make this type of switch practical, a hysteresis circuit is required. Without hysteresis, the strobing circuit would be quite susceptible to noise which could result in unstable strobing (multi-strobing). Thus, a positive feedback loop 80 is provided from the output 74 of the shift register to the input of the summing circuit 57, effectively providing the required hysteresis.

In addition to coded output signal as discussed heretofore, it is necessary for a keyboard to provide single channel continuous non-encoded or function output. The function keys are incorporated in and operated in the wiring matrix 10 in the same manner as the encoded keys. The output from such keys is generally continuous in that there is an output for each scanning cycle. The output is taken from the inverter 76 as indicated at 82 and is applied to the D input of one or more type "D" flip-flops 84. Each flip-flop 84 has an input at 86 from a decoder 88, the decoders being connected at 90 to the output of the count register 20. Each decoder generates a clock pulse for the flip-flop which is time coincident with a corresponding function signal from the multiplexer pulse. When a function key is actuated, the corresponding flip-flop will change state and will remain in this state as long as the function key is depressed. Since the flip-flop can only change state during the positive edge of the decoder pulse, a continuous output is thereby provided. The type "D" flip-flop thus provides a continuous output of high reliability at low cost as contrasted with prior art devices in which it has been necessary to rectify and filter a series of pulses with unsatisfactory results. Each of the flip-flops has an output as indicated at 92.

A strobe signal must not be generated by a function signal or during the transmission of a function signal. Accordingly, the decoder outputs 86 are all connected to an OR circuit 94, the output of which at 96 is connected to the strobe inhibit gate 68 for the purpose of inhibiting the strobe which would otherwise be generated during function period.

Keyswitch control circuits are provided for shifting to the supper case mode or the control mode. These signals are generated similarly to a function circuit and are applied to a code translator 100 at 104 to modify the code of the count register as required to provide the correct coded output at 106. The output 98 of one of the flip-flops 84 is connected to the code translator 100, and there is also input at 102 from the count register 20. The coded output 106 is also connected at 108 to a parity generator 110 to provide a parity bit output at 112.

It will be understood that the switches or keys as discussed in connection with FIG. 2 are analog switches, but operable with digital circuits. Including analog devices in digital circuits has always been a problem, yet this type of switch is a superior switch in that it has no make-and-break contact to fail. What makes this switch operable in the present circuit is the inclusion of the hysteresis feedback loop 80. The output signal from the switch will in general contain some noise components. As the switch is depressed and its output level increases ultimately the threshold level of the threshold detected will be reached. Due to the randomness of noise the signal level will vary above and below the threshold level for a number of scanning cycles, causing multiple strobing, until the signal has increased sufficiently such that noise components cannot drop the signal level below the threshold level. With hysteresis, however, after the first triggered signal, generated by the threshold detector, the shift register output pulse will be added to the input register and instantaneously the input level is well above the threshold level such that noise can have no effect on triggering. The hysteresis feedback loop is in the nature of a gated feedback circuit, and therefore hysteresis is applied only to depressed switches. Thus, there is no affect on the other switches.

Two aspects of the matrix are worthy of special attention, namely the use of the common drive return wire parallel to and in opposition to the drive wires forming a balanced drive system with reduced field radiation and subsequent noise and spurious signals that could cause improper operation from coupling into the sense wires. The use of the common mode signal along with the multiplexed sense wires signals coupled to a difference amplifier further lowers the noise level and helps to prevent spurious operation.

Attention also should be paid to the use of the type "D" flip-flops and associated signal decoder circuits to obtain a continuous function output.

The specific example of the invention is herein shown and described as for illustrative purposes only. Various changes will no doubt occur to those skilled in the art, and will be understood as forming a part of the present invention insofar as they fall within the spirit and scope of the appended claims.

The invention is claimed as follows:

1. An N-Key Rollover Type Keyboard comprising: a switching matrix having a plurality of drive wires and a plurality of sense wires arranged to form a plurality of junctures where signal coupling between said drive wires and said sense wires can occur, means for scanning said drive wires and said sense wires in timed relation, a plurality of manually operable switches for selectively coupling said drive wires and said sense wires at their junctures for coupling a series of pulses therebetween, a memory device having an output means sequentially coupling said sense wires to the input of said memory device to receive said series of pulses when present on the respective sense wires, a strobe generator, and means for coupling input signals of said memory device and output signals of said memory device to said strobe generator, said strobe generator comparing therein said input signals and said output signals to effect a strobe pulse output on the first scan of said sense wires when a switch at a given juncture is closed, said strobe pulse output being produced when said input and output signals are different and thereafter preventing a strobe pulse output when said output signal is the same; and wherein said means for sequentially coupling the sense wires to the input of the memory device comprises a multiplexer having an input connected to said sense wires, a summer connected to the output of the multiplexer, the output of the summer being connected to a threshold detector, and a pulse stretcher interconnecting the threshold detector and the memory device.

2. A keyboard as set forth in claim 1 and further including a gated hysteresis feedback loop combining a regenerative feedback signal to the input signal received from said sense wire to reduce the effects of noise on said sense wire.

3. A keyboard as set forth in claim 2 wherein each switch comprises an analog type switch.

4. A keyboard comprising, a switching matrix having a plurality of drive wires and a plurality of sense wires arranged to form a plurality of junctures where signal coupling between said drive wires and said sense wires can occur, drive circuits connected to said drive wires, a multiplexer connected to said sense wires for receiving signal information therefrom, switch means located at said plurality of junctures for selectively coupling said drive wires and said sense wires, a plurality of manually operable keys respectively associated with said switch means for operating the same, at least one function key associated with said plurality of keys, at least one flip-flop circuit, a clock pulse generator, means including a count register coupling said clock pulse generator with said drive circuits and said multiplexer, means coupling said clock pulse generator with said flip-flop circuit, and means connecting the signal information from said multiplexer and the count register to the flip-flop to hold the flip-flop in a particular position for a constant output therefrom.

5. A keyboard as set forth in claim 4 and further including a strobe pulse circuit, means interconnecting the multiplexer and the strobe pulse circuit to effect strobing pulse therefrom, and means interconnecting said flip-flop and said strobe pulse circuit to inhibit strobing thereof upon operation of said function key.

6. A keyboard as set forth in claim 5, wherein there is a plurality of function keys, a like plurality of flip-flops, a decoder for each flip-flop interconnecting said clock pluse generator and said flip-flops, and an OR gate having inputs connected to each of said decoders and having an output connected to said strobe pulse circuit as a strobe pulse inhibit signal.

7. A keyboard comprising a plurality of selectively operable matrix elements each having an actuated stated and an unactuated state, output means for scanning and sensing the state of each of said matrix elements in a sequential cyclic manner, memory means coupled to said output means for temporarily storing the sensed state of each of said matrix elements, output indicating means coupled to said output means for receiving a first signal representative of the state that the matrix element being scanned is in during the current scan cycle and coupled to said memory means for receiving a second signal representative of the state that the matrix element being scanned was in during the previous scan cycle, said output indicating means being constructed to provide an output data representation only when said first signal is representative of an actuated state of said scanned matrix element and said second signal is representative of an unactuated state of said scanned matrix element; and wherein said means for sequentially coupling the sense wires to the input of the memory device comprises a multiplexer having an input connected to said sense wires, a summer connected to the output of the multiplexer, the output of the summer being connected to a threshold detector, and a pulse stretcher interconnecting the threshold detector and the memory device.

8. A keyboard comprising a plurality of selectively operable matrix elements each having an actuated state and an unactuated state, output means for scanning and sensing the state of each of said matrix elements in a sequential cyclic manner, memory means coupled to said output means for temporarily storing the sensed state of each of said matrix elements, said output means comprising a threshold means coupled to said matrix elements and to said memory means and feedback means coupled to said memory means for transmitting a feedback signal representative of the state that the matrix element being scanned was in during the previous scan cycle, said feedback signal providing a first level to said threshold means when said feedback signal is representative of an unactuated state of said scanned matrix element and a second level to said threshold means when said feedback signal is representative of an actuated state of said scanned matrix element.

9. A keyboard comprising a plurality of selectively operable matrix elements each having an actuated stated and unactuated state, output means for scanning and sensing the state of each of said matrix elements in a sequential cyclic manner, memory means coupled to said output means for temporarily storing the sensed state of each of said matrix elements, output indicating means coupled to said output means for receiving a first signal representative of the state that the matrix element being scanned is in during the current scan cycle and coupled to said memory means for receiving a second signal representative of the state that the matrix element being scanned was in during the previous scan cycle, said output indicating means being constructed to provide an output data representation only when said first signal is representative of an actuated state of said scanned matrix element and the second signal is representative of an unactuated state of said scanned matrix element, said output means comprising a threshold means coupled to said matrix elements and to said memory means and feedback means coupled to said memory means for transmitting a feedback signal representative of the state that the matrix element being scanned was in during the previous scan cycle, said feedback signal providing a first level to said threshold means when said feedback signal is representative of an unactuated state of said scanned matrix element and a second level to said threshold means when said feedback signal is representative of an actuated state of said scanned matrix element.

10. A keyboard as in claim 9 wherein said second signal supplied to said output means is derived from said feedback signal.

11. A keyboard as in claim 9 wherein said second signal is the logical inverse of said feedback signal.

12. A keyboard encoder for generating a signal for each new key depressed in a keyboard having a plurality of keys, whether or not a previously depressed key still remains depressed, comprising: scanning means for serially scanning each key of the keyboard along a predetermined scan pattern to produce a signal information train containing one time interval for each of the keys of the keyboard, and containing within each such time interval a signal if the corresponding key is depressed, a circuit having at least first and second input terminals and an output terminal for generating an output signal whenever a signal appears on its first input terminal and not on its second input terminal, a storage device having storage capacity at least sufficient to store a number of signals equal to the number of keys of the keyboard, the output of said storage device being electrically connected to the second input terminal of the circuit, said circuit coupling said scanning means to said storage device for supplying said signal information train to said storage device to store therein information signals corresponding to one complete scan of the keyboard, circuit means coupling said scanning means to the first input terminal of said circuit for supplying said signal information train serially to said first input terminal, and means for synchronously advancing out of the storage means to the second input terminal of the circuit the information train then stored in the storage device from the previous scan of the keyboard, the output terminal on said circuit generating a key-detect signal when said first input terminal receives a signal from the present scan of the keyboard while the second input terminal fails to receive a signal from the corresponding key in the previous scan.

13. A keyboard encoder as in claim 12 wherein the storage device is a shift register.

14. A keyboard encoder as in claim 12 wherein the signals derived from the keyboard are digital in nature, being either of two levels depending upon whether or not a key is depressed, these signal levels representing the digits 1 and 0 respectively, and wherein the comparison circuit is a 0/1 detector in that it generates an output signal when the input signals on its first and second input terminals are a 1 and 0, respectively.

15. Apparatus for generating a plurality of pulses in a pulse train, each of said pulses being encoded in time position in response to actuation of one of a plurality of keys of an instrument, comprising in combination: a plurality of ferromagnetic cores arranged in a matrix having two sets of intersecting conducting lines, each of said cores occupying a position juxtaposed with an intersection of said sets; a magnetic field generator for normally maintaining each of said cores in saturated condition to render it incapable of transforming a signal from a line of said first set to a line of said second set; a movable member connected with each of said keys for selectively unsaturating one of said cores to permit said core to transform a signal from a line of said first set to a line of said second set; and a driver connected to one of said sets of lines for successively energizing individual ones of said cores to produce said pulse train in accordance with operated ones of said keys.

16. Apparatus according to claim 15 wherein said magnetic field generator comprises a permanent magnet juxtaposed with said core for normally maintaining it in a saturated condition.

17. Apparatus according to claim 15 wherein the cores of said matrix are arranged in a linear array, and said keys are arranged in a linear array directly above said cores.

18. In an electronic instrument having a plurality of selectively operable actuating members including selectively operable keys and control actuators, the combination comprising: a matrix formed with a plurality of conducting lines arranged in first and second sets, the lines of the first set intersecting the lines of the second set; a plurality of ferromagnetic core members juxtaposed with intersections of said matrix; a driver for applying pulses sequentially to the lines of said first set; enabling means for sequentially enabling the lines of said second set to successively and individually scan said core members; a plurality of movable magnetic field generators connected with said actuating members for selectively being movable to a position enabling individual ones of said core members to transform signals from the lines of said first set to the lines of said second set; and means connected to said matrix for producing output signals, when pulses are applied to said core members over the lines of said first set, in response to each enabled magnetic core member which is juxtaposed with an intersection of an enabled line of said second set.

19. Apparatus according to claim 18 wherein said actuating members comprise a plurality of keys arranged as a keyboard of an instrument.

20. Apparatus according to claim 18 wherein said enabling means is connected to the lines of said second set and arranged to provide, on a single output line, a train of pulses encoded in time position in response to operated ones of said actuating members.

21. Apparatus according to claim 18 including a counter and a source of clock pulses connected to said counter, said driver being connected to said counter and responsive to the state of said counter for successively energizing a plurality of outputs connected to the lines of said first set.

22. Apparatus according to claim 18 including a source of clock pulses and a counter connected to said clock pulses, said enabling means being connected with said counter and connected to energize individual lines of said second set in response to the state of said counter, for enabling each of the lines of said second set in response to said clock pulse source.

23. Apparatus according to claim 22 wherein said enabling means is connected to the lines of said second set and said means connected to said matrix produces an output signal whenever a signal is present on any of said second plurality of lines by the transforming action of one of said ferromagnetic members.

24. Apparatus according to claim 18 wherein said ferromagnetic members comprise ferromagnetic cores linking said lines at a plurality of intersections thereof.

25. Apparatus according to claim 18 wherein said magnetic field generators comprise a permanent magnet for each of said ferromagnetic members, said magnet being movable relative to its ferromagnetic member between a first position in which said magnetic member is magnetically saturated by the flux produced by said permanent magnet, and a second position at which said magnetic member is not magnetically saturated.

26. Apparatus according to claim 25 including support means for supporting said magnetic member in fixed condition, and a movable assembly connected with said actuating members for carrying said magnet, said assembly supported to be movable in rectilinear relationship relative to said ferromagentic member, said magnet being juxtaposed with said ferromagnetic member when said actuating member is in said first position, and displaced from said ferromagnetic member when said actuating member is moved to said second position.

27. Apparatus according to claim 18 including a decoder, connected with said enabling means and with said driver for generating a synchronizing pulse at a predetermined time within each cycle of said driver and said enabling means.

* * * * *